United States Patent
Fukuyama

[19]

[11] Patent Number: 6,140,953
[45] Date of Patent: *Oct. 31, 2000

[54] D/A CONVERTING APPARATUS WITH INDEPENDENT D/A CONVERTER CONTROLLED REFERENCE SIGNALS

[75] Inventor: Shinjiro Fukuyama, Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/132,969

[22] Filed: Oct. 7, 1993

[30] Foreign Application Priority Data

Oct. 14, 1992 [JP] Japan ......................................... 300581

[51] Int. Cl.[7] .................................................. H03M 1/70
[52] U.S. Cl. ........................... 341/144; 341/141; 341/139
[58] Field of Search .................................... 341/139, 141, 341/144, 145

[56] References Cited

U.S. PATENT DOCUMENTS

| | | | |
|---|---|---|---|
| 3,400,257 | 9/1968 | Smith | 341/144 |
| 4,168,528 | 9/1979 | Comer | 341/144 |
| 4,202,042 | 5/1980 | Connors et al. | 341/141 |
| 5,212,482 | 5/1993 | Okuyama | 341/139 |

FOREIGN PATENT DOCUMENTS

| | | | |
|---|---|---|---|
| 60-241330 | 11/1985 | Japan | H03M 1/70 |
| 1-292913 | 11/1989 | Japan | H03M 1/10 |
| 3-038925 | 2/1991 | Japan | H03M 1/66 |

OTHER PUBLICATIONS

Analog Devices' Data Converter Reference Manual 1992 vol. 1 D/A Converters pp. 2–399 to 2–404 and 2–721 to 2–732.

Mitsubishi Electric Corporation Semiconductor Department, "Mitsubishi '91 Data Book", Digi–Ana Interface/Gen. Purp. Linear IC Edition, Mar. 1991.

Fujitsu Ltd. Electronic Device Department, "Fujitsu Semiconductor Device 1991 Data Book", Mar. 1991.

*Primary Examiner*—Howard L. Williams
*Attorney, Agent, or Firm*—Rothwell, Figg, Ernst & Manbeck

[57] ABSTRACT

A D/A converting apparatus for converting a digital signal into an analog signal, wherein the reference signals of the maximum value and the minimum value of a main D/A converter are generated by the other two D/A converters, whereby the output voltage can be digitally adjusted and the accuracy of the output signal is improved.

8 Claims, 6 Drawing Sheets

D/A CONVERTING APPARATUS WITH INDEPENDENT D/A CONVERTER CONTROLLED REFERENCE SIGNALS

BACKGROUND OF THE INVENTION

1. Field of the Invention

The present invention relates to a D/A converting apparatus for converting an input digital signal into an analog signal of a voltage (or a current).

2. Description of the Related Art

Figure 1:
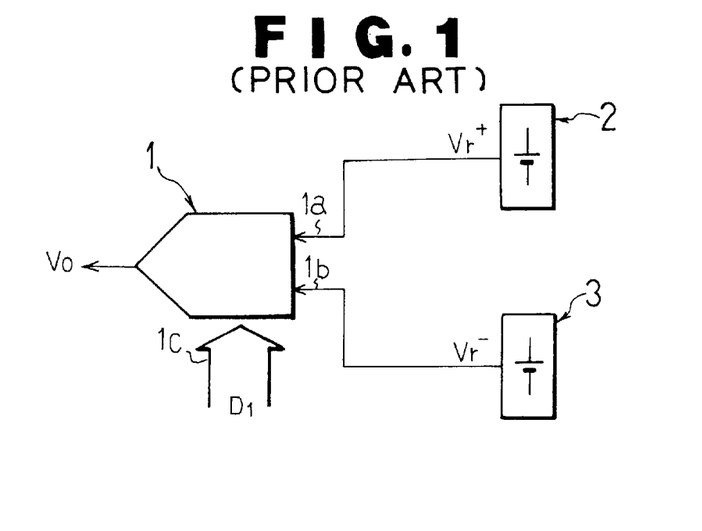
FIG. 1 is is a construction diagram showing a conventional D/A converting apparatus.

FIG. 1 is a basic construction diagram of a conventional D/A converting apparatus described in, for example, the "91 Mitsubishi Semiconductor Data Book Digi-Ana Interface/General Purpose Linear IC Edition". In the figure, 1 is a D/A converter, 2 is a constant voltage source for outputting a maximum reference voltage $Vr^+$, 3 is a constant voltage source for outputting a minimum reference voltage $Vr^-$, $1a$ and $1b$ are input terminals of the D/A converter 1 for inputting the above-mentioned voltages $Vr^+$ and $Vr^-$, $1c$ is a data input terminal group of the D/A converter 1 to which input digital signals (input data $D_1$) are applied, and $V_o$ is an analog output voltage obtained by the D/A conversion of the input data $D_1$.

Next, the operation of the D/A converting apparatus shown in FIG. 1 is described.

Assume that n-bit digital data $D_1$ are input through the data input terminal $1c$ into the D/A converter 1. Then the D/A converter 1 outputs an output voltage $V_o$ expressed as:

$$V_o = D_1(Vr^+ - Vr^-)/2^n + Vr^-$$

where $Vr^+$ and $Vr^-$ are input voltages respectively applied to the input terminals $1a$ and $1b$.

By the above-mentioned operation, the output voltage $V_o$ determined by the reference voltages $Vr^+$ and $Vr^-$ can be obtained. Accordingly, by adjusting the voltages of the constant voltage sources 2 and 3, the range of the output voltage $V_o$ can be determined.

Figure 2:
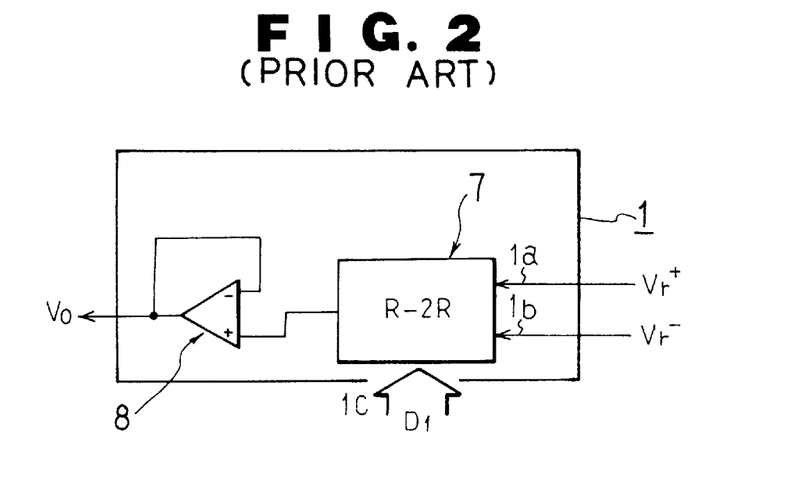
FIG. 2 is a construction diagram showing an example of the construction of a D/A converter.

FIG. 2 shows the construction of the D/A converter 1. As shown in the figure, the D/A converter 1 includes an n-bit R-2R ladder circuit 7 and a buffering operational amplifier 8. By applying the above-mentioned voltages $Vr^+$ and $Vr^-$ to the ladder circuit 7, an analog signal is output therefrom. The analog signal is input to a non-inverting input of the operational amplifier 8 so that the output voltage $V_o$ can be obtained from the operational amplifier 8.

Figure 3:
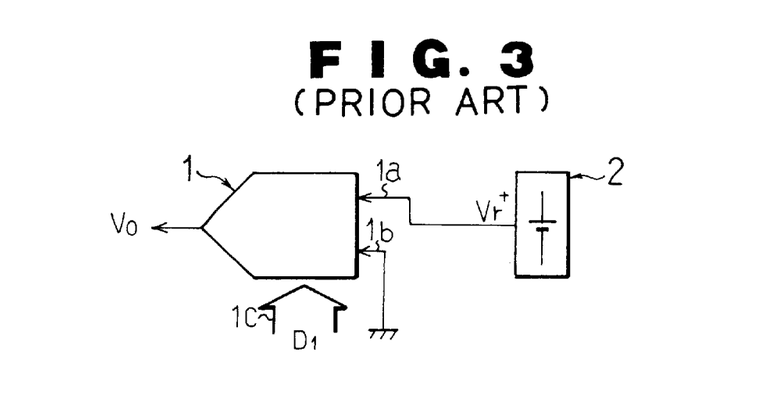
FIG. 3 is a construction diagram showing another conventional D/A converting apparatus.

FIG. 3 is a basic construction diagram of a conventional D/A converting apparatus. In the figure, the input terminal $1b$ for the minimum reference voltage of the D/A converter 1 is connected to the ground (0V); and the input terminal $1a$ is connected to receive the maximum reference voltage output from the constant voltage source 2. In this case, the output voltage $V_o$ is proportional to the maximum reference voltage $Vr^+$. Namely, the output voltage $V_o$ is expressed as follows.

$$V_o = (Vr^+/2^n) \cdot D_1$$

By the above-mentioned operation of the apparatus shown in FIG. 3, the output voltage $V_o$ determined by the maximum reference voltage $Vr^+$ can be obtained at the output of the D/A converter 1. Accordingly, by adjusting the voltage $Vr^+$ of the constant voltage source 2, the inclination of the output voltage $V_o$ with respect to the input data $D_1$ can be determined.

Since the conventional D/A converting apparatuses are constructed as described above, there is a problem in that it is necessary to adjust the analog voltages $Vr^+$ and $Vr^-$ in the apparatus shown in FIG. 1, or to adjust the analog voltage $Vr^+$ in the apparatus shown in FIG. 3. In addition, when only a part of the output range between $Vr^+$ and $Vr^-$ in FIG. 1 or between $Vr^+$ and 0 in FIG. 3 is necessary, only a certain range of the input data $D_1$ among the $2^n$ kinds of data is used so that there is a problem in that the accuracy corresponding to the number of bits cannot be obtained. For example, in FIG. 1, when only the lower half of the range between $Vr^+$ and $Vr^-$ is necessary in an n-bit D/A converting apparatus, only a value smaller than $2^{n-1}$ among data between 0 and $2^n-1$ is input as the input data $D_1$ so that there is a problem in that only an accuracy corresponding to a D/A converting apparatus of n-1 bits can be obtained.

SUMMARY OF THE INVENTION

In view of the foregoing, it is an object of the present invention to provide a D/A converting apparatus in which the output range can be set in a digital fashion.

Another object of the present invention is to provide a D/A converting apparatus in which the accuracy of the output voltage corresponds to the number of bits of the input data.

According to the first aspect of the present invention, for achieving the above-mentioned objects, there is provided a D/A converting apparatus comprising a main D/A converter having a maximum reference voltage input terminal and a minimum reference voltage input terminal, an another D/A converter having an output connected to the maximum reference voltage input terminal of the main D/A converter, and a still another D/A converter having an output connected to the minimum reference voltage input terminal of the main D/A converter, two reference voltages being applied to each of the other two D/A converters respectively.

In the above-mentioned D/A converting apparatus, the two reference voltages are provided respectively by a first constant voltage source for providing a maximum reference voltage and a second constant voltage source for providing a minimum reference voltage.

Each of the first, second, and third D/A converters provide an output voltage expressed by:

$$V_o = D_y(Vr^+ - Vr^-)/2^n + Vr^-$$

where $Vr^+$ is one of the two reference signals, $Vr^-$ is another one of the two reference signals, $D_y$ is an input digital signal to the y-th D/A converter, where y is an integer from 1 to 3, and n is the number of bits of the input digital signal.

The D/A converting apparatus further comprises a decoder for decoding a digital signal to output one of the first, second, and third digital signal in response to control data.

In the above-mentioned D/A converting apparatus, according to a second aspect of the present invention, the first D/A converter, the second D/A converter, and the third D/A converter are assembled as a one-chip semiconductor large scale integrated circuit.

According to a third aspect of the present invention, there is provided a D/A converting apparatus comprising plural sets of the first, second, and third D/A converters, each of the sets having the same constitution as the D/A converting apparatus of the first aspect of the present invention, the two reference signals being respectively common for all of the sets.

According to a fourth aspect of the present invention, there is provided a D/A converting apparatus for converting a digital signal into an analog signal, comprising a first D/A converter for outputting a first analog signal proportional to the product of a reference signal and a first digital signal both input to the first D/A converter, and a second D/A converter for converting a second digital signal into a second analog signal, the second analog signal being supplied to the first D/A converter, the second analog signal being supplied, as the reference signal, to the first D/A converter.

In the D/A converting apparatus of the fourth aspect of the present invention, according to a fifth aspect of the present invention, the first D/A converter and the the second D/A converter are assembled as a one-chip semiconductor large scale integrated circuit.

As stated above, according to the first, the third, and the fourth aspects of the present invention, by controlling the outputs of the above-mentioned another D/A converters by using digital data, the output range of the above-mentioned main D/A converter can be determined in a digital fashion.

According to the second and fifth aspects of the present invention, by assembling the D/A converters into one chip, the D/A converting apparatus can be miniaturized.

The above and further objects and novel features of the invention will more fully appear from the following detailed description when the same is read in connection with the accompanying drawings. It is to be expressly understood, however, that the drawings are for purpose of illustration only and are not intended as a definition of the limits of the invention.

DESCRIPTION OF THE PREFERRED EMBODIMENTS

Embodiment 1

In the following, an embodiment of the first aspect of the present invention will be described with reference to the drawings.

Figure 4:
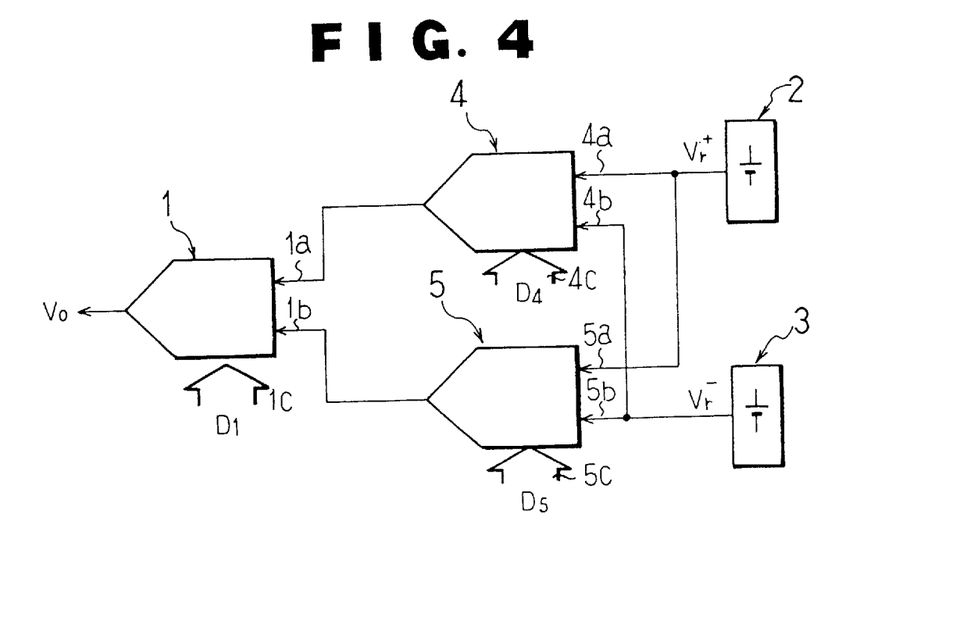
FIG. 4 is a construction diagram showing a D/A converting apparatus according to an embodiment 1 of the first aspect of the present invention.

In FIG. 4, reference numerals 1, 4, and 5 are D/A converters, and reference numerals 2 and 3 are constant voltage sources. The output voltage $Vr^+$ of the constant voltage source 2 is applied, as a maximum reference signal, to input terminals 4a and 5a of the D/A converters 4 and 5. The outputs of the D/A converters 4 and 5 are respectively applied to a maximum reference signal input terminal 1a and a minimum reference input terminal 1b of the D/A converter 1. The D/A converters 1, 4, and 5 have data input terminal groups 1c, 4c, and 5c for receiving input data $D_1$, $D_4$, and $D_5$ from an external world.

The D/A converters 1, 4 and 5 are the first, the second, and the third D/A converters; the input data $D_1$, $D_4$, and $D_5$ of the first, the second, and the third D/A converters are the first, the second, and the third digital signals; and the output signals of the first, the second, and the third D/A converters are the first, the second, and the third analog signals.

Next, the operation of the D/A converting apparatus shown in FIG. 4 will be described.

In FIG. 4, the maximum value and the minimum value of the output voltage $V_o$ of the D/A converter 1 are determined by the voltages at the input terminals 1a and 1b. The voltages at the input terminals 1a and 1b are the output voltages of the D/A converters 4 and 5, respectively. The output voltages of the D/A converters 4 and 5 can be set within a range between the maximum value equal to the output voltage $Vr^+$ of the constant voltage source 2 and the minimum value equal to the output voltage $Vr^-$ of the constant voltage source 3, in accordance with the input data $D_4$ and $D_5$ of the D/A converters 4 and 5. Accordingly, the range of the output voltage $V_o$ of the D/A converter 1 can be easily set digitally while the voltage of the constant voltage sources 2 and 3 are fixed.

Embodiment 2

Figure 5:
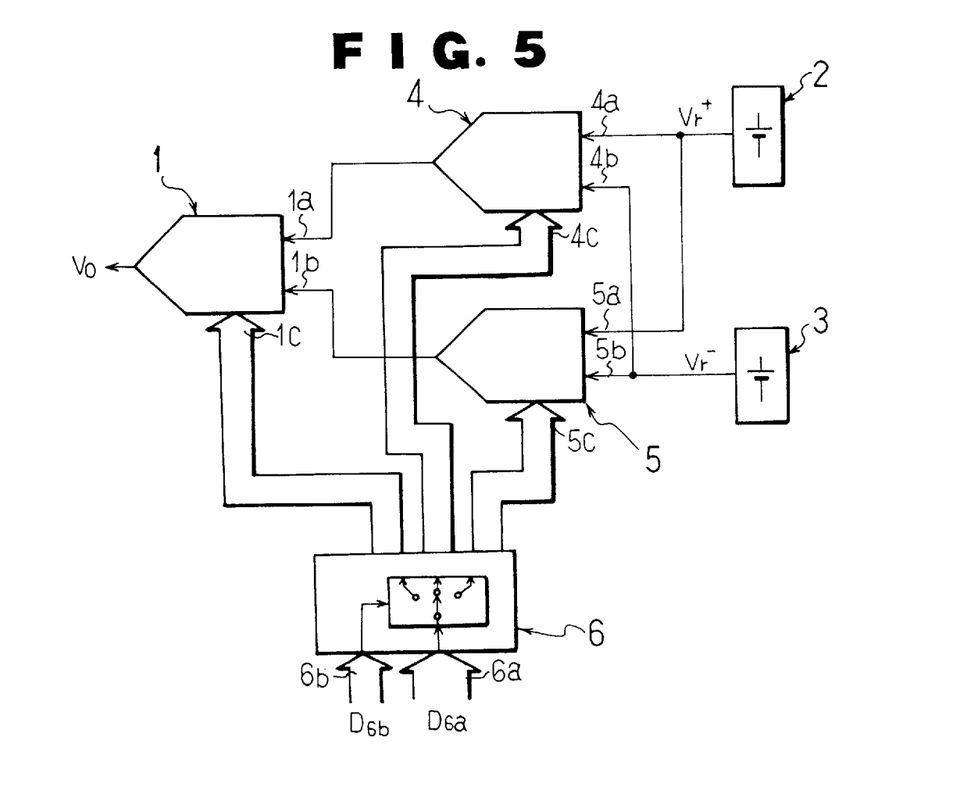
FIG. 5 is a construction diagram showing a D/A converting apparatus according to an embodiment 2 of the first aspect of the present invention.

FIG. 5 is a construction diagram showing a D/A converting apparatus according to another embodiment of the present invention. In the above-described embodiment 1, the data input terminal groups 1c, 4c, and 5c of the D/A converters 1, 4, and 5 are separated. By contrast, in this embodiment 2, a data input terminal group 6a, a function terminal group 6b, and a decoder 6 are provided to combine the data input terminal groups 1c, 4c, and 5c into the data input terminal group 6a.

In FIG. 5, the decoder 6 determines, in response to the state of the data $D_{6_b}$ input to the function input terminal group 6b, one of the D/A converters 1, 4, and 5 to which input data $D_{6_a}$ are to be output. Accordingly, by designating the contents of the data $D_{6_b}$ at the function terminal group 6b, input data can be input to a desired D/A converter.

Figure 6:
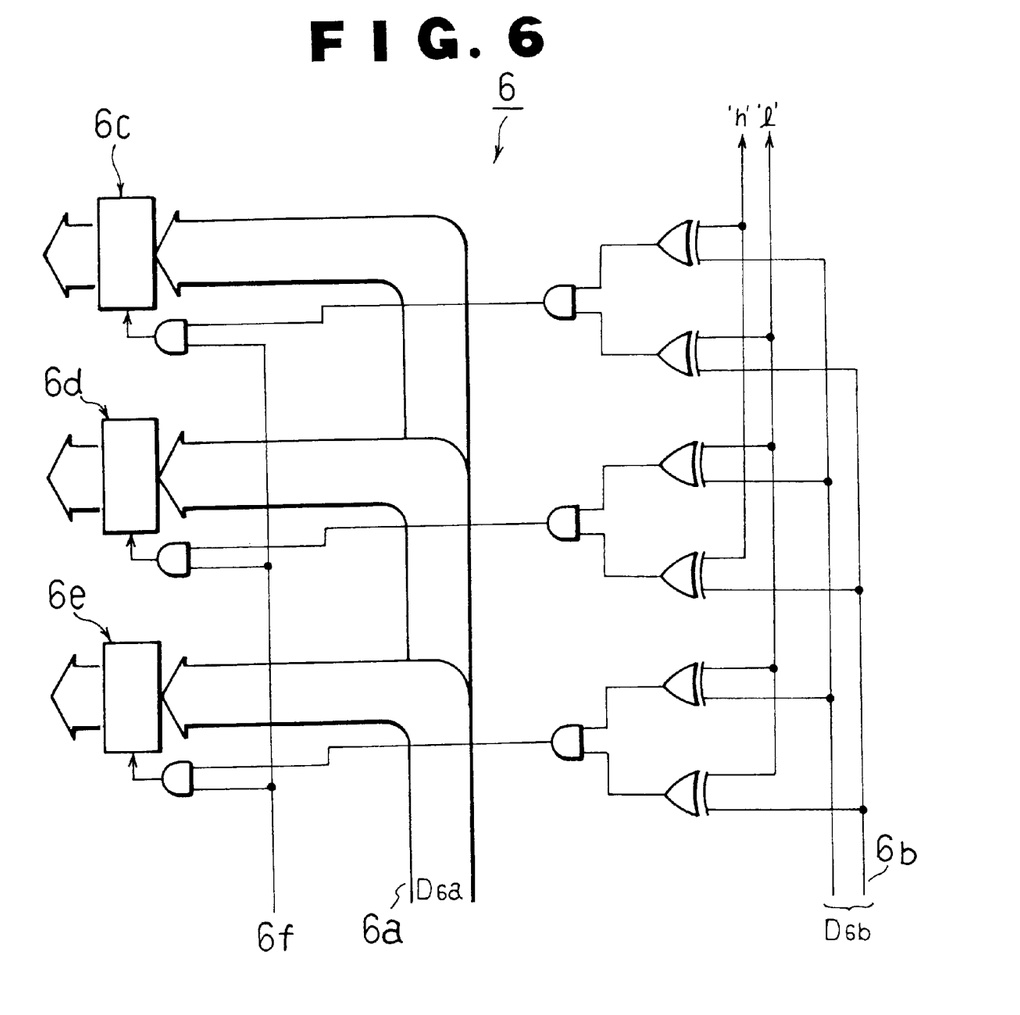
FIG. 6 is a construction diagram showing an embodiment of a decoder in the D/A converting apparatus of the above-mentioned embodiment 2.

FIG. 6 is a logic circuit diagram showing an embodiment of the above-mentioned decoder 6. As shown in the figure, the decoder 6 includes latching circuits 6c, 6d, and 6e, and a logic circuit operable to select one of the latching circuits 6c, 6d, and 6e in response to the above-mentioned data $D_{6_b}$.

When one of the latching circuits 6c, 6d, and 6e is selected to be supplied with the input data $D_{6_a}$ by the data $D_{6_b}$, and when a latching signal 6f is given, the input data $D_{6_a}$ is latched in the selected latching circuit so that the input data $D_{6_a}$ is supplied to the corresponding one of the D/A converters 1, 4, and 5 shown in FIG. 5. Note that even when the output destination of the input data D6 a is changed, the original data is maintained in the originally selected latching circuit.

Embodiment 3

In the above-described embodiments 1 and 2, only one channel is provided as the output of the D/A conversion. By contrast, FIG. 7 shows a still another embodiment in which a D/A converting apparatus has a plurality of output channels.

Figure 7:
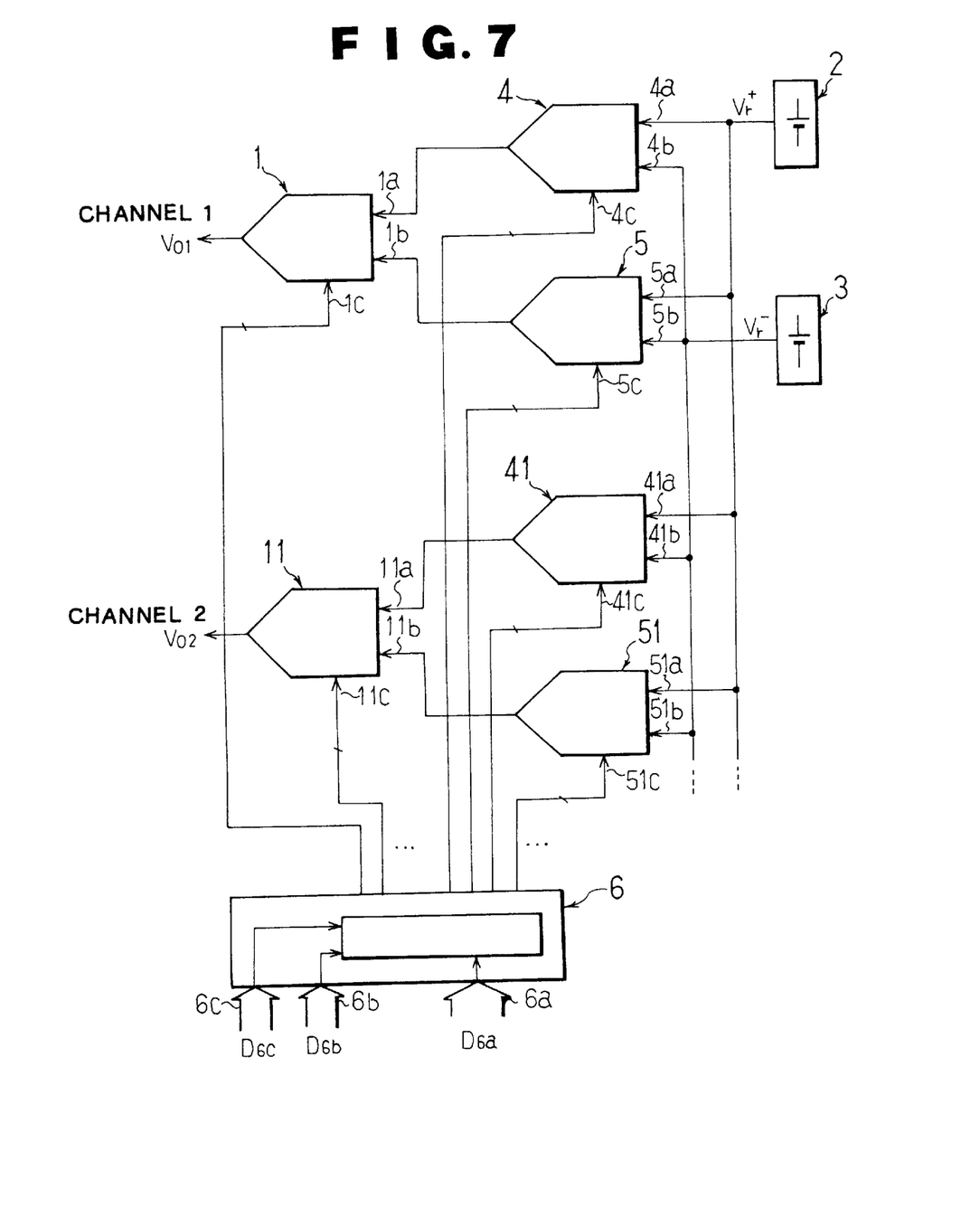
FIG. 7 is a construction diagram showing a D/A converting apparatus according to an embodiment 3 of the third aspect of the present invention.

In FIG. 7, the D/A converter 1 outputs an output voltage $V_o{}^1$ of a channel 1; and a D/A converter 11 outputs an output voltage $V_o{}^2$ of a channel 2. To input terminals 11a and 11b of the D/A converter 11, the output signals from the two D/A converters 41 and 51 are applied. To input terminals 41a, 41b, 51a, 51b of D/A converters 41 and 51, the constant voltage sources 2 and 3 are connected. Data input terminal groups 1c, 4c, 11c, 41c, and 51c, of the D/A converters 1, 4, 11, 41, and 51 are connected to a decoder 61.

In the above construction, the decoder 61 operates in accordance with a channel address $D_{6_c}$ supplied to a channel address input terminal group 6c, the input data $D_{6_b}$ supplied to the function terminal group 6b, and the input data $D_{6_a}$ supplied to the data input terminal group 6a, in a similar way as the decoder 6 in the embodiment 2 shown in FIG. 6.

Embodiment 4

Figure 8:
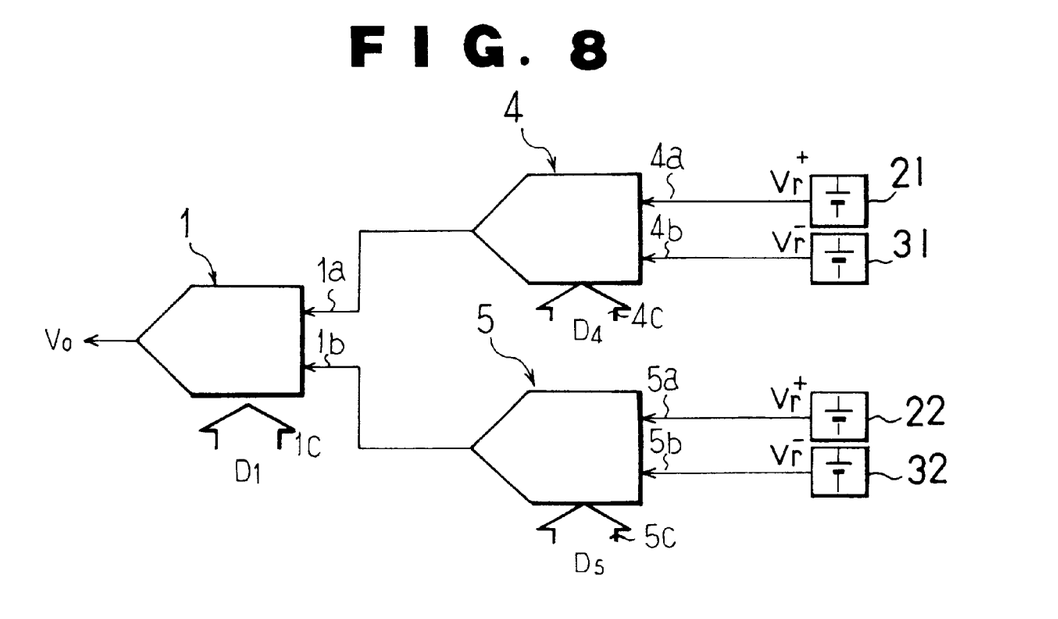
FIG. 8 is a construction diagram showing a D/A converting apparatus according to an embodiment 4 of the first aspect of the present invention.

In the above-described embodiment 1, 2, and 3, the D/A converters 4 and 5 or 4, 5, 41, and 51 uses the common reference signals from the common constant voltage sources 2 and 3, however, it is also possible to use reference signals from independent constant voltage sources. For example, as shown in FIG. 8, the D/A converter 4 may be connected to two constant voltage sources 21 and 31, and the D/A converter 5 may be connected to another two constant voltage sources 22 and 32. Similarly, the D/A converters 4 and 5 shown in FIG. 5 or the D/A converters 4, 5, 41, and 51 shown in FIG. 7 may use different sets of constant voltage sources.

Embodiment 5

In the above-described embodiments 1, 2, 3, and 4, the input data at each data input terminal group are parallel data, however, it is also possible to input serial data into the decoder.

Embodiment 6

Figure 9:
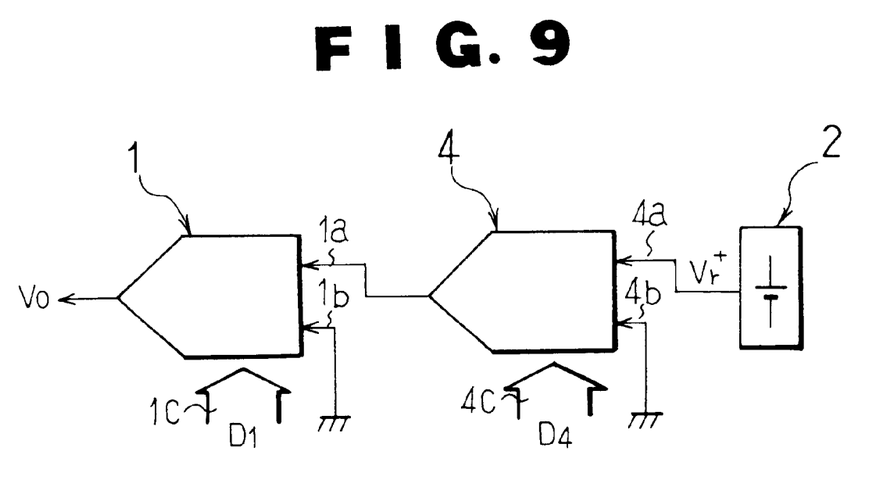
FIG. 9 is a construction diagram showing a D/A converting apparatus according to an embodiment 6 of the fourth aspect of the present invention.

FIG. 9 is a construction diagram showing a D/A converting apparatus according to an embodiment of the fourth aspect of the present invention. In the figure, reference numerals 1 and 4 are D/A converters, and 2 is a constant voltage source. The voltage $Vr^+$ from the constant voltage source 2 is applied to an analog input terminal 4a of the D/A converter 4. Another input terminal 4b of the D/A converter 4 is grounded. The output terminal of the D/A converter 4 is connected to an analog input terminal 1a of the D/A converter 1. Another input terminal 1b of the D/A converter 1 is grounded. The D/A converters 1 and 4 have data input terminal groups 1c and 4c for receiving input data $D_1$ and $D_4$ from the external world. In this embodiment, the D/A converter 1 is the first D/A converter, and the D/A converter 4 is the second D/A converter.

Next, the operation of the D/A converting apparatus shown in FIG. 9 will be described. In FIG. 9, the inclination of the output signal of the D/A converter 1 with respect to the input data $D_1$ is determined by the voltage at the terminal 1a. Namely, the output voltage $V_o$ is expressed as follows:

$$V_o = D_1 V_o{}^4 / 2^n$$

where $V_o{}^4$ is the input voltage at the terminal 1a of the D/A converter 4, and n is the number of bits of the data $D_1$. On the other hand, the voltage $V_o{}^4$ at the terminal 1a is the output voltage of the D/A converter 4 so that the voltage $V_o{}^4$ can be set, within a range in which the voltage $Vr^+$ of the constant voltage source 2 is the maximum voltage, in accordance with the input data $D_4$ of the D/A converter 4. Namely, the voltage $V_o{}^4$ is expressed as follows $$V_o{}^4 = D_4 Vr^+ / 2^n$$

Accordingly, the range of the output voltage $V_o$ can be digitally set while the voltage $Vr+$ of the constant voltage source 2 is fixed.

Embodiment 7

Figure 10:
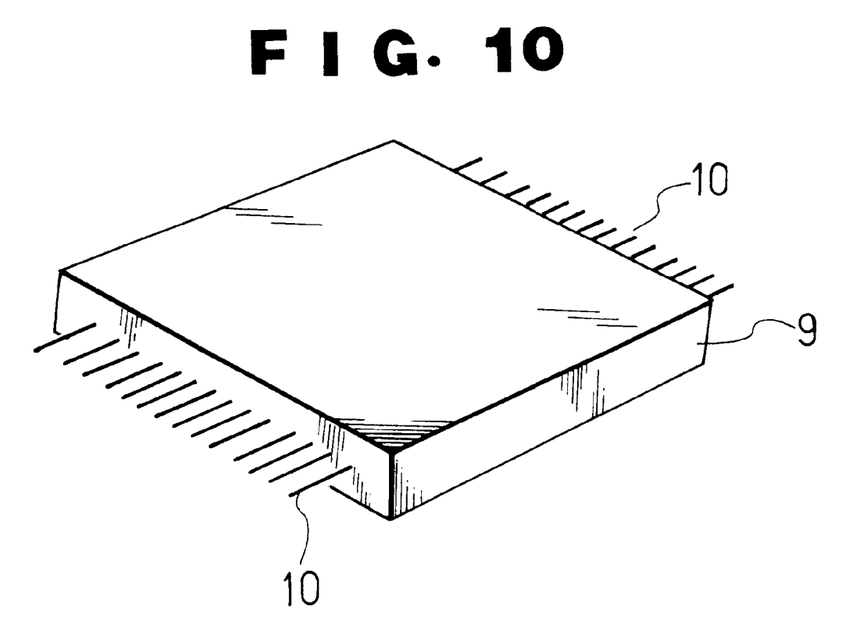
FIG. 10 is a perspective view showing a D/A converting apparatus according to an embodiment 7 of the second and fifth aspects of the present invention.

FIG. 9 is a perspective view of the D/A converting apparatus according to an embodiment of the second and fifth aspects of the present invention. In the figure, 9 is a housing of a one-chip semiconductor large scale integrated circuit, 10 represents a plurality of electrodes provided on the housing 9.

In the above-mentioned semiconductor large scale integrated circuit, one of the D/A converting apparatus shown in FIG. 4, FIG. 5, FIG. 7, FIG. 8, and FIG. 9 is assembled.

As described above, according to the first aspect of the present invention, in a D/A converting apparatus, the reference signals of the maximum value and the minimum value of a main D/A converter are generated by the other two D/A converters.

According to the third aspect of the present invention, plural sets of three D/A converters are provided in a D/A converting apparatus, and each set comprises the above-mentioned main D/A converter and the other two D/A converters.

According to the fourth aspect of the present invention, in a D/A converting apparatus, as one reference signal of a main D/A converter, the output of another D/A converter is used.

According to the second and fifth aspects of the present invention, the main D/A converter and the other one or more D/A converters are assembled as one chip LSI.

As a result, according to the first aspect, the third aspect, or the fourth aspect of the present invention, in a D/A converting apparatus, a desired output range can be easily set in a digital fashion, and an accuracy corresponding to the number of bits of the input data can be obtained even when a narrower range of the output voltage is used in accordance with the use.

According to the second or the fifth aspect of the present invention, a D/A converting apparatus can be miniaturized.

What is claimed is:

1. A D/A converting apparatus for converting a digital signal into an analog signal, comprising:

a first D/A converter for converting said digital signal as a first digital signal into said analog signal as a first analog signal, the output range of said first analog signal being determined by a second and a third analog signal as reference signals input to said first D/A converter;

a second D/A converter for converting a second digital signal into said second analog signal, the output range of said second analog signal being determined by two reference signals input to said second D/A converter; and a third D/A converter for converting a third digital signal into said third analog signal, the output range of said third analog signal being determined by two reference signals input to said third D/A converter; wherein said first digital signal, said second digital signal, and said third digital signal each represent separate digital values, and wherein said first D/A converter, said second D/A converter and said third D/A converter are configured in a cascade arrangement, with circuit components of said second D/A converter being completely separated from circuit components of said first D/A converter.

2. A D/A converting apparatus as set forth in claim 1, wherein said two reference signals input to said second D/A converter are respectively common to said two reference signals input to said third D/A converter.

3. A D/A converting apparatus as set forth in claim 2, wherein said two reference signals are provided respectively by a first constant voltage source for providing a maximum reference voltage and a second constant voltage source for providing a minimum reference voltage.

4. A D/A converting apparatus as set forth in claim 3, wherein each of said first, second, and third D/A converters provide an output voltage expressed by:

$$V_o = D_y(Vr^+ - Vr^-)/2^n + Vr^-$$

where Vr+ is one of the two reference signals, Vr− is another one of the two reference signals, $D_y$ is an input digital signal to the y-th D/A converter, where y is an integer from 1 to 3, and n is the number of bits of the input digital signal.

5. A D/A converting apparatus as set forth in claim 1 further comprising a decoder for decoding a digital signal to output one of said first, second, and third digital signal in response to control data.

6. A D/A converting apparatus as set forth in claim 1, wherein said first D/A converter, said second D/A converter, and said third D/A converter are constructed as a one-chip semiconductor large scale integrated circuit.

7. A D/A converting apparatus as set forth in claim 1 comprising plural sets of said first, second, and third D/A converters, said two reference signals being respectively common for all of said sets.

8. A variable operating range D/A converting apparatus for converting a digital signal into an analog signal and implementing a variable operating range output without relying on resistance-based output potential division, comprising:

a first D/A converter for converting said digital signal as a first digital signal into said analog signal as a first analog signal, the output range of said first analog signal being determined by a second and a third analog signal as reference signals input to said first D/A converter;

a second D/A converter for converting a second digital signal into said second analog signal, the output range of said second analog signal being determined by two reference signals input to said second D/A converter; and a third D/A converter for converting a third digital signal into said third analog signal, the output range of said third analog signal being determined by two reference signals input to said third D/A converter; wherein said first digital signal, said second digital signal, and said third digital signal each represent separate digital values, and wherein said first D/A converter, said second D/A converter and said third D/A converter are configured in a cascade arrangement, and are coupled to separate respective data buses.

* * * * *